United States Patent [19]

Cranston et al.

[11] Patent Number: 4,734,753
[45] Date of Patent: Mar. 29, 1988

[54] THERMOCOMPRESSION BONDING OF COPPER LEADS TO A METALLIZED CERAMIC SUBSTRATE

[75] Inventors: Benjamin H. Cranston, Hopewell Township, Mercer County, N.J.; Richard L. Hunsberger, Spring Township, Berks County, Pa.; Donald A. Machusak, Hopewell Township, Mercer County, N.J.

[73] Assignees: American Telephone and Telegraph Company; AT&T Technologies, Inc., both of Berkeley Heights, N.J.

[21] Appl. No.: 921,908

[22] Filed: Oct. 27, 1986

Related U.S. Application Data

[63] Continuation of Ser. No. 718,498, Apr. 1, 1985, abandoned.

[51] Int. Cl.$^4$ .............................................. H01L 23/50
[52] U.S. Cl. ..................................... 357/67; 228/203; 228/180.2; 357/80
[58] Field of Search ...................... 228/116, 173.6, 203, 228/232, 180.2; 357/72, 80, 70, 67

[56] References Cited

U.S. PATENT DOCUMENTS

| | | | |
|---|---|---|---|
| 4,016,050 | 4/1977 | Lesh et al. | 204/15 |
| 4,069,916 | 1/1978 | Fowler et al. | 206/330 |
| 4,234,666 | 11/1980 | Gursky | 428/573 |
| 4,563,811 | 1/1986 | Cranston | 29/827 |

OTHER PUBLICATIONS

*Metals Handbook*, vol. 2, Ninth Edition, 1979, p. 241.
Rogers, "How Fairchild Makes Its New Face-Down Bonded Microcircuits", *Insulation*, Nov. 1967, pp. 48–51.
*Understanding Copper Alloys, The Manufacture and Use of Copper, Copper Alloy Sheet and Strip*, edited by J. Mendenhall (Olin Corporation), 1977, pp. 26–29 and 68–85.

*Primary Examiner*—Kenneth J. Ramsey
*Attorney, Agent, or Firm*—Robert B. Levy; Douglas Kirk

[57] ABSTRACT

Copper leads having an average grain size from 0.035 to 0.055 mm are thermocompression bonded to a metallized portion of a ceramic substrate. Surprisingly, such large grain size substantially decreases the "ceramic pullout" of the bonded leads.

5 Claims, 2 Drawing Figures

THERMOCOMPRESSION BONDING OF COPPER LEADS TO A METALLIZED CERAMIC SUBSTRATE

This is a continuation of application Ser. No. 718,498, filed Apr. 1, 1985 now abandoned.

TECHNICAL FIELD

The instant invention relates to a method of thermocompression bonding of copper leads to metallized portions of a ceramic substrate.

BACKGROUND OF THE INVENTION

It is well known to thermocompression bond copper leads to metallized portions of ceramic substrates. Such a technique is described in copending U.S. Patent application to B. H. Cranston, Ser. No. 546,714, filed on Oct. 28, 1983 and titled "A Lead Frame and Dual-in-Line Package Fabricated Using Said Frame", now U.S. Pat. No. 4,563,811, which is assigned to the instant assignee and is hereby incorporated by reference herein. That application discloses, inter alia, the thermocompression bonding of soft copper leads of a lead frame to metallized bonding pads on a ceramic substrate.

One known disadvantage of such thermocompressive bonding is "ceramic pullout" which may result either during bonding of the copper lead to the metallized bonding pad and/or the testing of the bond. Ceramic pullout occurs when the lead is being deformed during bonding or when a pulling force is applied to the bonded lead until a failure occurs in which the lead separates from the substrate with a portion of the ceramic substrate attached to the lead. Such ceramic pullout results in the loss of the device.

Various techniques have been tried to lessen the ceramic pullout problem. In particular, the parameters of time, temperature, pressure and materials associated with the thermocompression bonding process have been adjusted. However, such adjustments have not resulted in a solution to the problem.

Thus, there is a need for a technique to decrease the ceramic pullout failures associated with thermocompression bonding of copper leads to metallized ceramic substrates.

SUMMARY OF THE INVENTION

The foregoing problems have been overcome in an electronic device comprised of: a ceramic substrate having metallized patterns thereon; a semiconductor chip bonded to first ends of the metallized patterns; and at least one copper lead, having an average grain size from 0.035 to 0.055 mm, thermocompressively bonded to the second ends of the metallized patterns.

Surprisingly, it has been discovered that such large grain size in the copper lead results in a substantial decrease in ceramic pullout.

DETAILED DESCRIPTION

Figure 1:
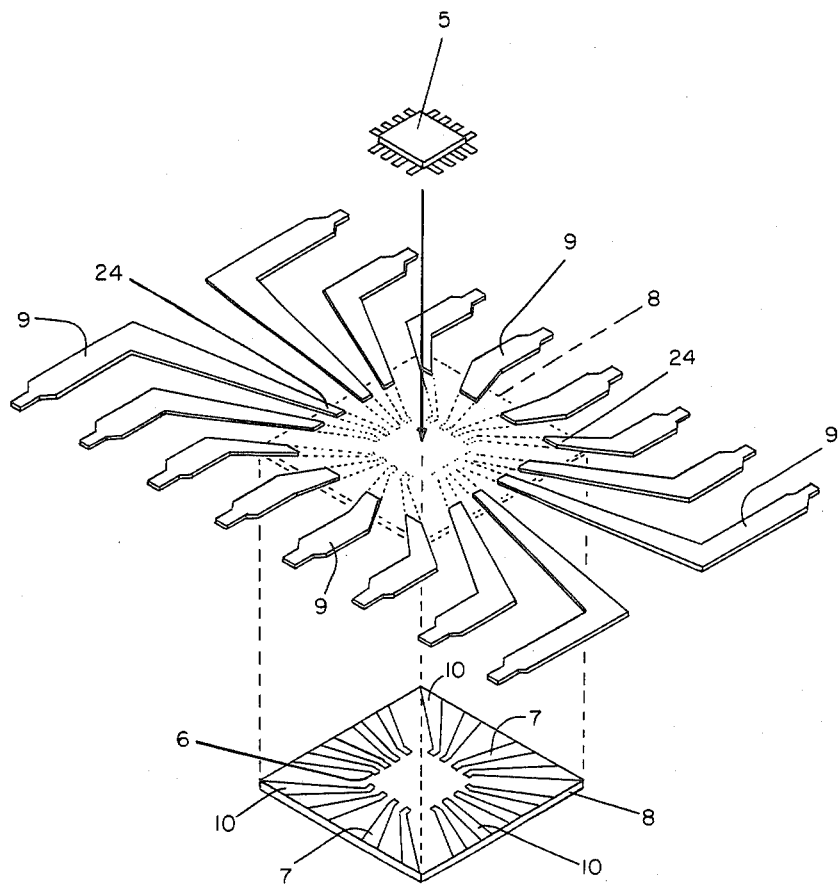
FIG. 1 is an exploded view showing the relationship of a ceramic substrate and copper leads to be bonded thereto.

FIG. 1 is an exploded view of the components that comprise a dual-in-line package (DIP). A semiconductor beam leaded chip 5 is bonded to first ends 6—6 of metallic leads 7—7 on a ceramic substrate 8—8. The leads 7—7 are of a tri-metal material with titanium and palladium layers plated with gold. Copper leads 9—9 are thermocompression bonded to the second ends 10—10 of the leads 7—7. The copper leads 9—9 have a nickel-gold coating on the ends to be bonded.

Figure 2:
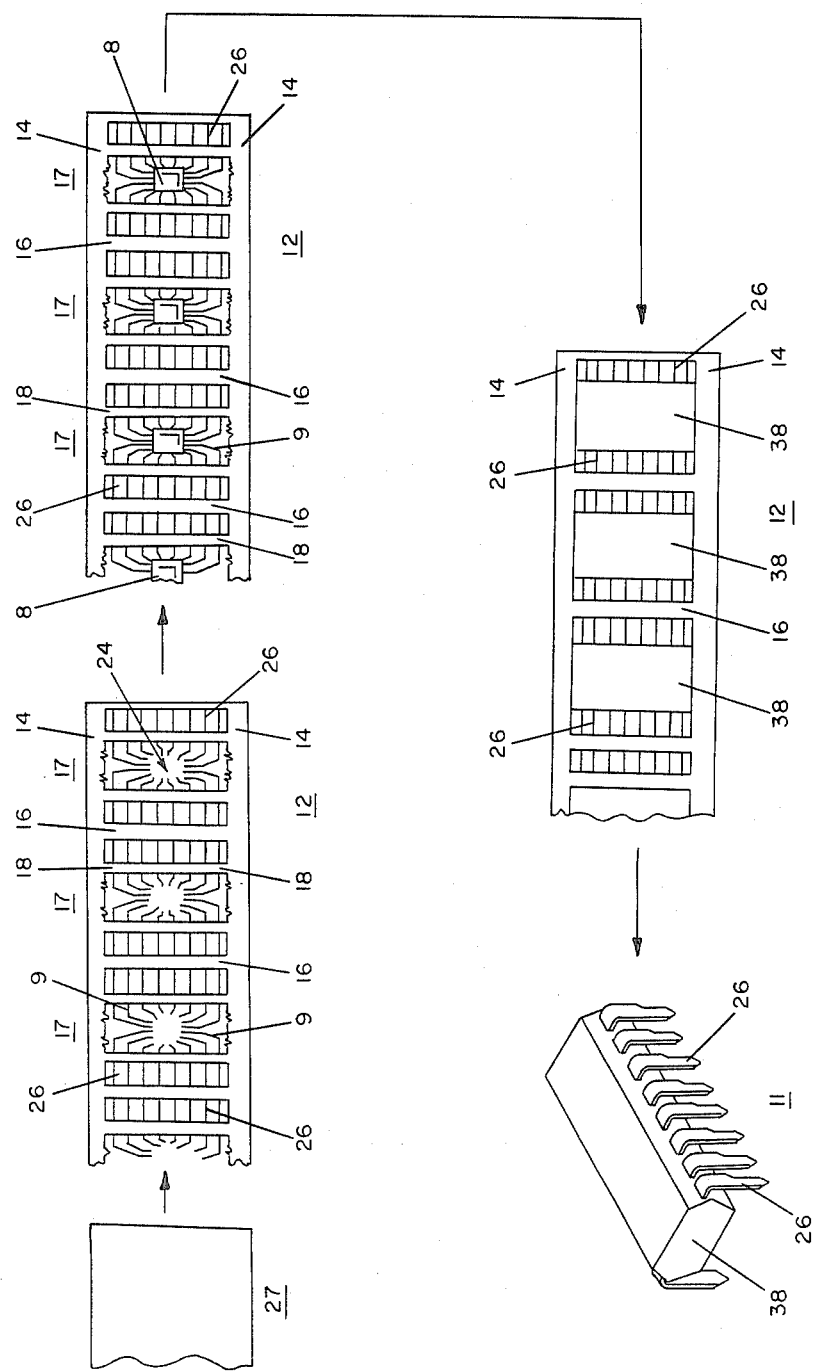
FIG. 2 depicts the sequence of forming a lead frame and thermocompressively bonding copper leads thereto.

A typical technique used to fabricate a DIP 11 is shown in FIG. 2. A lead frame 12 is comprised of a pair of lateral support members 14—14 connected together by a plurality of tie bars 16—16 with a repetitive lead pattern 17 therebetween. Additionally, a plurality of support members 18—18 are connected between lateral support members 14—14. Each lead pattern 17 is comprised of a plurality of internal leads 9—9 which extend from the support members 18—18 to a centrally located rectangular array of ends 24—24. A plurality of external leads 26—26 is parallel to the lateral support members 14—14 and each lead is connected between the tie bars 16—16 and the support members 18—18.

Typically, the lead frame 12 is fabricated by indexing a continuous soft metal (e.g., CDA 102 copper or the like) strip 27 into a punch press (not shown) which repetitively punches out the lead pattern 17. The ends 24—24 of the leads 9—9 and leads 26—26 are then coated with nickel which is then electroplated with gold. The metallized ceramic substrate 8 having a semiconductor chip 5 (see FIG. 1) bonded thereto is placed in contact with the lead frame 12 and the ends 24—24 of the internal copper leads 9—9 thermocompression bonded to the respective leads 7—7.

The ceramic substrates 8—8 may then be encapsulated with RTV silicone rubber (not shown) in a well known manner and the lead frame 12 placed in a molding machine wherein a body 38 of plastic material (e.g., epoxy, silicon, etc.) is formed about a portion of each pattern 17 as shown in FIG. 2. The lead frame 11 is then cut into individual sections and the leads trimmed and formed into a DIP 11.

Copper lead frame material specifications have historically been directed to mechanical properties such as: yield strength, tensile strength, microhardness and percent elongation. The internal physical properties such as grain formations were not a consideration. This has been justified by the rationale that the deformation which occurs during thermocompression bonding is a function of the compression yield strength. However, we have discovered that ceramic pullout is related to the grain size of the copper prior to bonding. In particular, we found that large grain size (e.g., from 0.035 to 0.055 mm) results in less ceramic pullout.

Although the mechanism is not fully understood, it is believed that there are lower localized stresses imposed on the ceramic by larger grains which is related to the mechanics of plastic deformation. It is known that in polycrystalline metals grain boundaries interfere with slip because the planes on which dislocations move are not continuous. Therefore, a larger grain material tends to be more ductile at ambient temperatures where grain boundaries are normally stronger than the internal grain structure. However, at the temperature required for thermocompression bonding (e.g., 300° C.), the principle deformation processes also include sub-grain formation and grain boundary sliding. This type of deformation is characterized by extreme inhomogeneity which would result in imposed stress concentrations upon the ceramic surface which leads to fracture of the ceramic in the bond region - ceramic pullout.

Initially, grain size is a function of solidification of the metal from a melt. This can be controlled to a large extent by varying cooling rates. Due to the kinetics of grain formation and growth, quickly cooled metals will have smaller grains. Grain size also varies with the number of nucleation sites available during solidification.

After solidification, grain size can be altered by annealing or cold-work processes. For example, annealing a small grain metal to promote recrystallization can result in either smaller or larger grains depending on internal stresses within the grains and nucleation sites. However, carrying the annealing process further (higher temperature-longer times) will result in grain growth where larger grains are formed as small grains are consumed. Once solidified, smaller grains can be formed through extreme cold-work of the metal. Usually, excessive deformation will cause the larger grain to fragment and form sites for smaller highly stressed grains. These grains with proper heat treatment can be stress relieved without promoting grain growth.

Considering copper lead frame materials, the grain size can be controlled in two ways: (1) the metal can be heat treated to a very soft, large grained material and then cold-worked to obtain smaller recrystallized grains, or (2) the metal can be cold-worked first and then annealed to promote recrystallization or even grain growth. It is difficult to theoretically predict grain size and the required heat treatment, but once the proper treatment or cold-work process has been determined experimentally, it is repeatable.

Standard copper lead frame materials are provided with an ASTM 9-10 grain size (average grain diameter of 0.015 mm). The large grained copper which has been found to produce a more homogeneous stress on the ceramic are typically ASTM 6-7 (average grain diameter of 0.045 mm).

It is known that thermocompression bondability of copper to a ceramic substrate is improved by using a softer material. However, there is no direct correlation with the grain size of copper and microhardness as can be seen in Table I. For example, the grain size of copper material A having a grain size of 0.015 mm has a microhardness of 104 while material B having a large grain structure of 0.065 had a microhardness of 112.

TABLE I

Grain Size and Microhardness In Cross-Section

| Copper Material | GS (mm) | Microhardness (DPH$_{100}$) | | | | | |
|---|---|---|---|---|---|---|---|
| | | $\bar{\chi}$ | $\eta$ | $\sigma$ | max | min | range |
| A | .015 | 104 | 25 | 3.0 | 110 | 98 | 12 |
| B* | | | | | | | |
| all gr | .045 | 109 | 25 | 6.2 | 126 | 101 | 25 |
| sm gr | .025 | 106 | 12 | 4.2 | 116 | 101 | 15 |
| lg gr | .065 | 112 | 13 | 6.5 | 126 | 104 | 22 |
| C | .040 | 111 | 25 | 5.2 | 121 | 102 | 19 |

GS - Grain size - which is determined by comparing the microstructure with ASTM non-ferrous grain size standard and is reported as normal diameter in mm.
$\bar{\chi}$ - average microhardness taken in a cross-section of the material.
$\eta$ - number of reading in the cross-section.
$\sigma$ - standard deviation.
*material B is a duplex grain structure. The data is the average for all grains combined and separately for the larger and smaller grains.

The standard material used in the past has been a CDA 102 copper material shown as material A in Table I.

The results of a study done to determine the effects of grain size of copper on ceramic pullout are shown in Table II.

TABLE II

Thermocompression Bonding Study

| Copper Material | GS | Temp (°C.) | Psig | Def (%) | Leads Tested | FMA | | | |
|---|---|---|---|---|---|---|---|---|---|
| | | | | | | LF (%) | PLF (%) | INT (%) | CP (%) |
| A | 9-10 | 385 | 240 | 64 | 1600 | 55.9 | 16.9 | 0 | 27.2 |
| | | 385 | 255 | 65 | 1600 | 60.0 | 19.6 | 0 | 20.4 |
| | | 385 | 275 | 66 | 1600 | 64.7 | 21.1 | 0 | 14.2 |
| | | 385 | 300 | 69 | 1584 | 65.0 | 21.3 | 0.1 | 13.6 |
| B | 6-7 | 385 | 240 | 67 | 1568 | 74.8 | 16.8 | 0.9 | 7.5 |
| | | 385 | 255 | 69 | 1568 | 84.0 | 12.6 | 0.1 | 3.3 |
| | | 385 | 275 | 70 | 1600 | 90.6 | 7.9 | 0 | 1.5 |
| | | 385 | 300 | 71 | 1584 | 90.6 | 8.5 | 0 | 0.9 |
| C | 6-7 | 385 | 240 | 67 | 1584 | 87.2 | 10.4 | 0.1 | 2.3 |
| | | 385 | 255 | 68 | 1584 | 90.3 | 8.7 | 0 | 1.0 |
| | | 385 | 275 | 69 | 1552 | 94.0 | 5.9 | 0 | 0.1 |
| | | 385 | 300 | 72 | 1584 | 95.5 | 4.2 | 0 | 0.3 |

Psig - The thermocompression bonding pressure is applied in two stages, the first stage is 70 psig for 9 seconds and second stage indicated in Table II for 30 seconds. Normal production setting is 240.
Def - The average deformation is determined by checking one inside lead on each side of 4 substrates.
FMA - Failure Mode Analysis determined by destructive push testing all 16 leads simultaneously on each ceramic.
a. LF is 100% lead failure where the entire bonded area remains intact.
b. PLF is a partial lead failure, 100% > LF > 0%.
c. INT is an interface or gold to gold failure, poor bond between lead and substrate.
d. CP is a ceramic pullout with no lead left bonded.

The information in Table II clearly indicates that the larger grain material - from 0.035 to 0.055 mm nominal diameter - had less ceramic pullout that the small grain at all identical parameter settings.

What is claimed is:

1. An electronic device comprising:
    a ceramic substrate having metallized patterns thereon;
    a semiconductor chip bonded to first ends of the metallized patterns; and
    at least one unalloyed copper lead, having an average grain size from 0.035 to 0.055 mm, with a portion thereof thermocompressively bonded to a second end of the metallized pattern.

2. The device as set forth in claim 1, characterized in that:
    the substrate and the chip bonded thereto are encapsulated.

3. A cermic substrate having a semiconductor device bonded to first ends of a plurality of gold plated leads on said substrate and ends of unalloyed copper leads thermocompressively bonded to second ends of the gold plated leads, wherein the copper lead material has an average grain size from 0.035 to 0.055 mm which large grain size reduces ceramic pullout.

4. The invention as set forth in claim 3 wherein the ceramic substrate and the semiconductor device bonded thereto are encapsulated.

5. A method of bonding an unalloyed copper lead to a metallized area of a cermic substrate, comprising the step of:

thermocompressively bonding a portion of the copper lead, which has an average grain size from 0.035 to 0.055 mm, to the metallized area of the ceramic substrate.

* * * * *